United States Patent
Chang et al.

(10) Patent No.: US 10,629,852 B2
(45) Date of Patent: Apr. 21, 2020

(54) MICROLENS FOR AN OLED DISPLAY DEVICE

(71) Applicant: GM Global Technology Operations LLC, Detroit, MI (US)

(72) Inventors: Kai-Han Chang, Sterling Heights, MI (US); Thomas A. Seder, Fraser, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 72 days.

(21) Appl. No.: 15/968,015

(22) Filed: May 1, 2018

(65) Prior Publication Data

US 2019/0341581 A1    Nov. 7, 2019

(51) Int. Cl.
*H01L 51/52* (2006.01)
*H01L 27/32* (2006.01)
*G02B 3/00* (2006.01)

(52) U.S. Cl.
CPC ........ *H01L 51/5275* (2013.01); *G02B 3/0056* (2013.01); *H01L 27/3211* (2013.01)

(58) Field of Classification Search
CPC ............. H01L 51/5275; H01L 27/3211; H01L 27/3216; G02B 19/0066; G02B 3/0056
See application file for complete search history.

(56) References Cited

U.S. PATENT DOCUMENTS

2011/0181974 A1*  7/2011  Hori ................... H01L 51/5271
                                                                359/891

\* cited by examiner

*Primary Examiner* — Jasmine J Clark
(74) *Attorney, Agent, or Firm* — Quinn IP Law

(57) ABSTRACT

An organic light-emitting diode (OLED) pixel is composed of a plurality of subpixel elements and one or more lenses, including first, second and third subpixel elements that emit light beams having first, second and third colors, respectively. The first subpixel element exhibits a first light divergence angle, the second subpixel element exhibits a second light divergence angle, and the third subpixel element exhibits a third light divergence angle. A first lens is disposed on the second subpixel element, with a first refractive index to refract the light beam of the second subpixel element to a light divergence angle that is equivalent to the first light divergence angle. A second lens is disposed on the third subpixel element, with a refractive index to refract the light beam of the third subpixel element to a divergence angle that is equivalent to the first light divergence angle.

20 Claims, 3 Drawing Sheets

MICROLENS FOR AN OLED DISPLAY DEVICE

INTRODUCTION

Optical display devices such as organic light-emitting diode (OLED) display devices may exhibit color shifts at oblique viewing angles.

SUMMARY

An optical device is described, and includes an organic light-emitting diode (OLED) pixel composed of a plurality of subpixel elements and one or more lenses. The subpixel elements include a first subpixel element disposed to emit a first light beam having a first color, a second subpixel element disposed to emit a second light beam having a second color, and a third subpixel element disposed to emit a third light beam having a third color. The first subpixel element exhibits a first light divergence angle, the second subpixel element exhibits a second light divergence angle, and the third subpixel element exhibits a third light divergence angle. A first lens is disposed on the second subpixel element, and is formed to have a first refractive index that is configured to refract the second light beam of the second subpixel element to a second refracted light divergence angle that is equivalent to the first light divergence angle. A second lens is disposed on the third subpixel element, and is formed to have a second refractive index that is configured to refract the third light beam of the third subpixel element to a third refracted light divergence angle that is equivalent to the first light divergence angle.

An aspect of the disclosure includes the first lens disposed on the second subpixel element being a convex lens.

Another aspect of the disclosure includes the first and second lenses disposed on the second subpixel element being convex lenses that are disposed as a single unitary lamination layer.

Another aspect of the disclosure includes the first lens disposed on the second subpixel element being a concave lens.

Another aspect of the disclosure includes the first and second lenses being convex lenses that are disposed as a single unitary lamination layer.

Another aspect of the disclosure includes the first color being red, the second color being green and the third color being blue.

Another aspect of the disclosure includes the first and second lenses being composed from two different materials that display flat optics employing a gradient refractive index lens.

Another aspect of the disclosure includes the first and second lenses being composed from two different materials that display flat optics employing a gradient refractive index lens and a liquid crystal element.

Another aspect of the disclosure includes an optical device including an organic light-emitting diode (OLED) pixel composed of a plurality of subpixel elements, wherein the subpixel elements include a first subpixel element disposed to emit a first light beam having a first color and a second subpixel element disposed to emit a second light beam having a second color. The first subpixel element exhibits a first light divergence angle, and the second subpixel element exhibits a second light divergence angle. A first lens is disposed on the second subpixel element, wherein the first lens is formed having a first refractive index, wherein the first refractive index is configured to refract the second light beam of the second subpixel element to a second refracted light divergence angle that is equivalent to the first light divergence angle.

The above features and advantages, and other features and advantages, of the present teachings are readily apparent from the following detailed description of some of the best modes and other embodiments for carrying out the present teachings, as defined in the appended claims, when taken in connection with the accompanying drawings.

BRIEF DESCRIPTION OF THE DRAWINGS

One or more embodiments will now be described, by way of example, with reference to the accompanying drawings, in which:

FIG. 1-2 schematically shows a side view of a single organic light-emitting diode (OLED) pixel including three subpixel elements with corresponding emitted light beams and light divergence angles, in accordance with the disclosure;

FIG. 2 graphically shows normalized luminance in relation to a viewing angle for each of a red pixel, a green pixel and a blue pixel, in accordance with the disclosure;

It should be understood that the appended drawings are not necessarily to scale, and present a somewhat simplified representation of various preferred features of the present disclosure as disclosed herein, including, for example, specific dimensions, orientations, locations, and shapes. Details associated with such features will be determined in part by the particular intended application and use environment.

DETAILED DESCRIPTION

The components of the disclosed embodiments, as described and illustrated herein, may be arranged and designed in a variety of different configurations. Thus, the following detailed description is not intended to limit the scope of the disclosure, as claimed, but is merely representative of possible embodiments thereof. In addition, while numerous specific details are set forth in the following description in order to provide a thorough understanding of the embodiments disclosed herein, some embodiments can be practiced without some of these details. Moreover, for the purpose of clarity, certain technical material that is understood in the related art has not been described in detail in order to avoid unnecessarily obscuring the disclosure. Furthermore, the drawings are in simplified form and are not to precise scale. For purposes of convenience and clarity, directional terms such as top, bottom, left, right, up, over, above, below, beneath, rear, and front, may be used with respect to the drawings. These and similar directional terms are not to be construed to limit the scope of the disclosure. Furthermore, the disclosure, as illustrated and described herein, may be practiced in the absence of an element that is not specifically disclosed herein.

Figure 1:
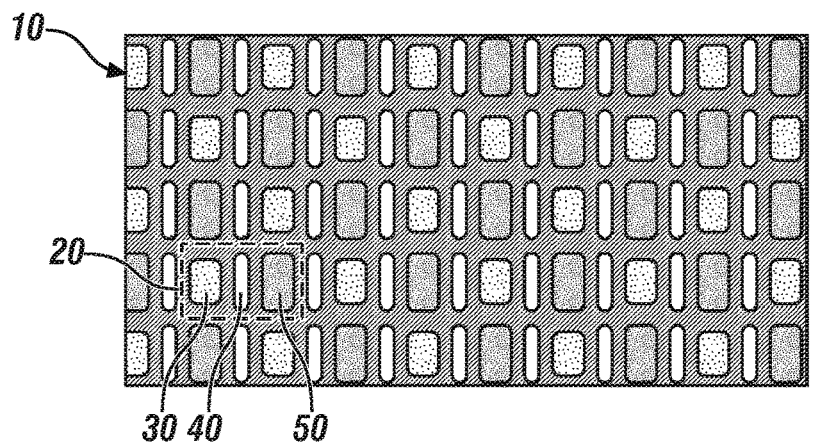
FIG. 1-1 schematically shows a plan view of an example array of organic light-emitting diode (OLED) pixels, wherein a single one of the OLED pixels includes three subpixel elements, in accordance with the disclosure.
Figures 1, 2:
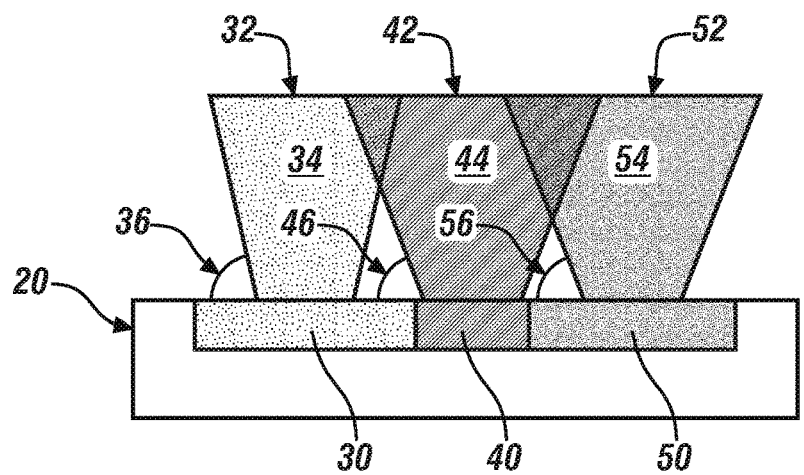
Figure 2:
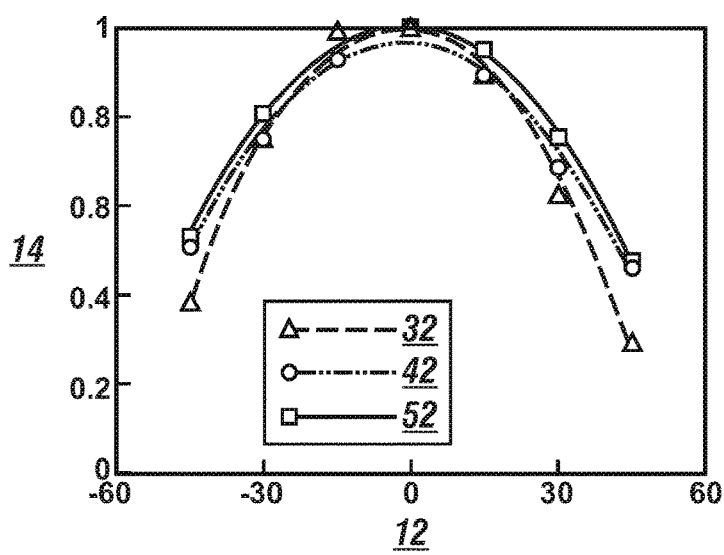

Referring to the drawings, wherein like reference numerals correspond to like or similar components throughout the several Figures, FIG. 1-1 schematically shows a plan view of an optical display device 10 that is arranged as a two-dimensional array of organic light-emitting diode (OLED) pixels 20, wherein a single one of the OLED pixels includes three subpixel OLED elements 30, 40 and 50. This arrangement of the subpixel OLED elements 30, 40 and 50 is illustrative of one embodiment; it is appreciated that other arrangements of the subpixel elements fall within the scope of this disclosure. FIG. 1-2 schematically shows a side view of a single one of the OLED pixels 20, with corresponding subpixel OLED elements 30, 40 and 50. In one embodiment, the three subpixel OLED elements 30, 40 and 50 emit red, green and blue (i.e., RGB) light beams, respectively, indicated as follows: first beam 32 having the color red 34, second beam 42 having the color green 44, and third beam 52 having the color blue 54. Alternatively, the subpixel OLED elements 30, 40 and 50 may emit various desired light colors and are not limited to emitting RGB lights. The red subpixel OLED element 30 emits the first, red beam 32 at a first light divergence angle 36. The green subpixel OLED element 40 emits the second, green beam 42 at a second light divergence angle 46. The blue subpixel OLED element 50 emits the third, blue light beam 52 at a third light divergence angle 56. The first, second and third light divergence angles 36, 46 and 56 are characteristic to the corresponding light beam 32, 42, 52, respectively as a result of the manufacturing process for OLED pixels 20. An electrical controller (not shown) is advantageously employed to selectively activate the subpixel OLED elements 30, 40 and 50 of each of the OLED pixels 20 of the optical display device 10.

FIG. 2 graphically shows a normalized luminance shown on a vertical axis 14, in relation to a viewing angle, as indicated on a horizontal axis 12, for examples of the red beam 32, green beam 42 and blue beam 52 emitted from an embodiment of the OLED pixel 20 including OLED subpixel elements red 30, green 40 and blue 50. The normalized luminance is also referred as an angular distribution. These results indicate a definite and discernible difference in luminance between the between red beam 32, green beam 42 and blue beam 44 that is associated with a change in the viewing angle. The angular distribution of normalized emission intensity is not the same for various original colors at least in part due to microcavity resonance, which is a characteristic of the OLED subpixels. Red tends to have narrower emission peak. Furthermore, there is a color shift and a color temperature drift at oblique viewing angles. The resonance peak wavelength shows a blue-shift behavior when the viewing angle increases, i.e., becomes more oblique.

Figure 3:
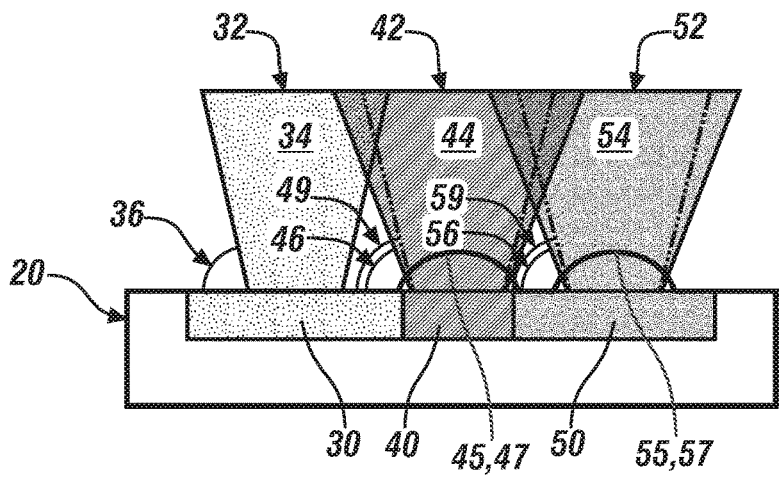
FIG. 3 schematically shows a side view of an embodiment of a single one of the OLED pixels including three subpixel elements including a first convex lens and a second convex lens and corresponding light divergence angles, in accordance with the disclosure.

FIG. 3 schematically shows a side view of an embodiment of a single one of the OLED pixels 20, with corresponding subpixel OLED elements 30, 40 and 50, having a first lens 45 and a second lens 55. In one embodiment, the three subpixel OLED elements 30, 40 and 50 emit red, green and blue (i.e., RGB) light beams 34, 44, 54, respectively. In this embodiment, the first subpixel OLED element 30 has no lens. The second subpixel OLED element 40 is fitted with the first lens 45 and the third subpixel OLED element 50 is fitted with the second lens 55. In this embodiment, the first light beam 32 being emitted from the first subpixel OLED element 30 has a characteristic first light divergence angle 36. In this embodiment, the first lens 45 is a convex lens that is disposed on the second subpixel OLED element 40. The first lens 45 is formed having a first refractive index 47, wherein the first refractive index 47 is configured to refract the second light beam 42 of the second subpixel element 40 to a second refracted light divergence angle 49 that is equivalent to the first light divergence angle 36. The first lens 45 can be fabricated from a transparent material having a refractive index that is greater than 1.0. The lens effect may be formed via a surface curvature, and polymeric material is desired because of its ease of fabrication. Polymeric materials may include polycarbonate, with a nominal refractive index of 1.58, and PMMA, with a nominal refractive index of 1.49. The surface curvature of a microlens can be formed by molding techniques or other methods. The second lens 55 is a convex lens that is disposed on the third subpixel OLED element 50. The second lens 55 has a second refractive index 57, wherein the second refractive index 57 is configured to refract the third light beam 52 of the third subpixel element 50 to a third refracted light divergence angle 59 that is equivalent to the first light divergence angle 36. In this embodiment the first and second lens 45, 55 are micro-optic devices, i.e., microlenses, that are directly printed onto the corresponding second and third subpixel OLED elements 40, 50 employing an inkjet-type printer or a related device. The first and second lenses 45, 55 are employed to beam-shape the second and third (i.e., green and blue) light beams 42, 52 by beam convergence. This configuration reduces color shifts at oblique viewing angles, and may extend service life of the optical display device 10 that employs the OLED pixels 20. The refractive index of a material is a dimensionless number that describes how light propagates through that medium.

Figure 4:
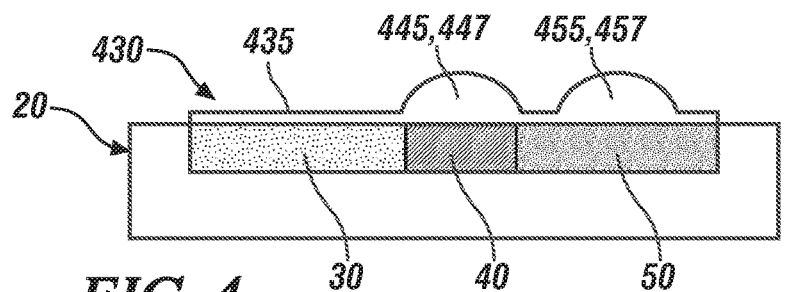
FIG. 4 schematically shows a side view of another embodiment of a single one of the OLED pixels including three subpixel elements including a first convex lens and a second convex lens, in accordance with the disclosure.

FIG. 4 schematically shows a side view of another embodiment of a single one of the OLED pixels 20, with corresponding subpixel OLED elements 30, 40 and 50, and a single lens element 430 including a first lens 435, a second lens 445 and a third lens 455. In this embodiment, the first lens 435 is a flat lens that is disposed on the subpixel OLED element 30. As appreciated, a flat lens has no refractive effect. The second lens 445 is disposed on the second subpixel OLED element 40 and the third lens 455 is disposed on third subpixel OLED element 50. In this embodiment, the second lens 445 is a convex lens that is formed to have a first refractive index 447, wherein the first refractive index 447 is configured to refract the second light beam 42 of the second subpixel element 40 to the second refracted light divergence angle 49 that is equivalent to the first light divergence angle 36, as shown with reference to FIG. 3. The third lens 455 is a convex lens that is disposed on the third subpixel OLED element 50. The third lens 455 has a second refractive index 457, wherein the second refractive index 457 is configured to refract the third light beam 52 of the third subpixel element 50 to the third refracted light divergence angle 59 that is equivalent to the first light divergence angle 36, as shown with reference to FIG. 3. In this embodiment the single lens element 430 with first and second lens 435, 445 is formed as a laminate sheet that may be applied onto a surface of the OLED pixels 20. This configuration reduces color shifts at oblique viewing angles.

Figure 5:
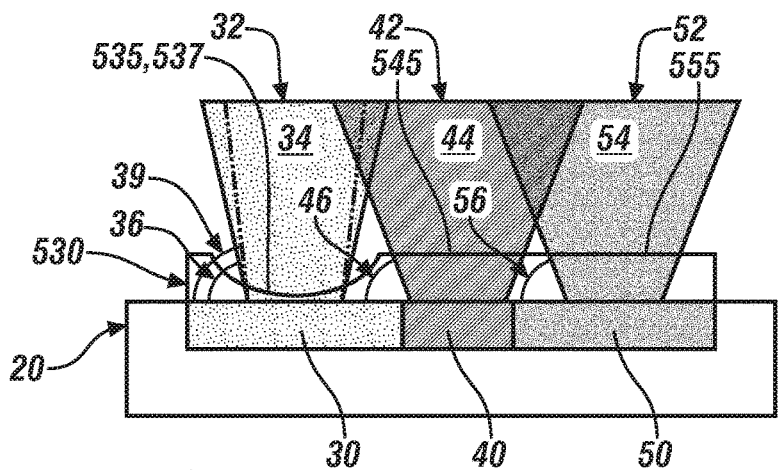
FIG. 5 schematically shows a side view of another embodiment of a single one of the OLED pixels including three subpixel elements including a first concave lens, second flat lenses and corresponding light divergence angles, in accordance with the disclosure.

FIG. 5 schematically shows a side view of another embodiment of a single one of the OLED pixels 20, with corresponding subpixel OLED elements 30, 40 and 50, and a single lens element 530 including a first lens 535, a second lens 545 and a third lens 555. In this embodiment, the first lens 535 is a concave lens that is disposed on the subpixel OLED element 30. The second lens 545 is disposed on the second subpixel OLED element 40 and the third lens 555 is disposed on third subpixel OLED element 50. In this embodiment, the second lens 545 and the third lens 555 are flat lenses. The first lens is a concave lens that is formed to have a first refractive index 537, wherein the first refractive index 537 is configured to refract the first light beam 32 of the first subpixel element 30 to achieve a refracted light divergence angle 39 that is equivalent to the second light divergence angle 46 that is associated with the second light beam 42 being emitted from the second subpixel OLED element 40. In this embodiment the single lens element 530 is formed as a laminate that can be applied onto a surface of the OLED pixels 20. The first lens 535 is employed to beam-shape the first (i.e., red) light beam 32 by beam divergence in this embodiment. This configuration reduces color shifts at oblique viewing angles.

Figure 6:
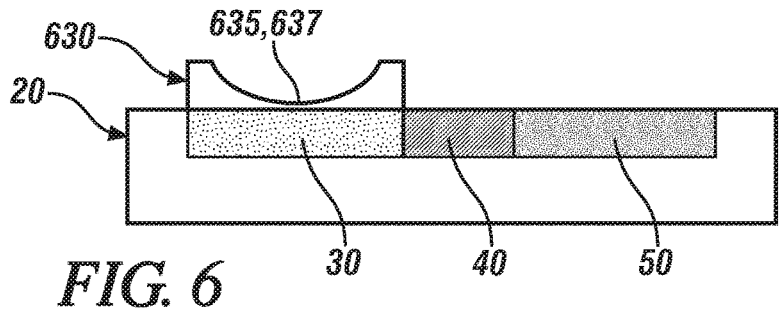
FIG. 6 schematically shows a side view of another embodiment of a single one of the OLED pixels including three subpixel elements including a first concave lens, in accordance with the disclosure.

FIG. 6 schematically shows a side view of another embodiment of a single one of the OLED pixels 20, with corresponding subpixel OLED elements 30, 40 and 50, and a single lens element 630 including a first lens 635. In this embodiment, the first lens 535 is a concave lens that is disposed on the subpixel OLED element 30. The second subpixel OLED element 40 and the third subpixel OLED element 50 are uncovered. The first lens 535 is a concave lens that is formed to have a first refractive index 637, wherein the first refractive index 637 is configured to refract the first light beam 32 of the first subpixel element 30 to achieve a refracted light divergence angle 39 that is equivalent to the second light divergence angle 46 that is associated with the second light beam 42 being emitted from the second subpixel OLED element 40, analogous to that which is depicted in FIG. 5. In this embodiment the single lens element 630 is formed as a laminate that can be applied onto a surface of the subpixel OLED element 30 of each of the OLED pixels 20. This configuration reduces color shifts at oblique viewing angles.

Figure 7:
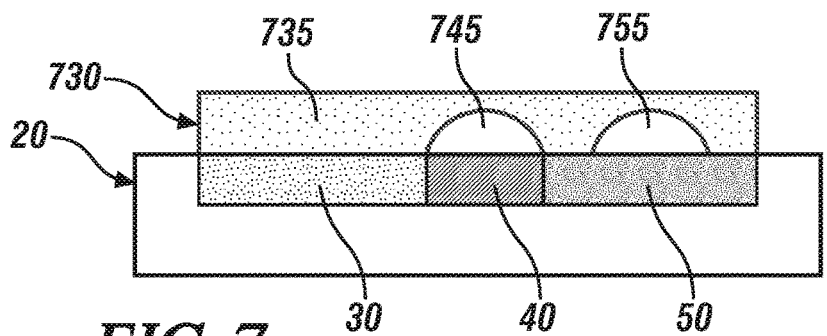
FIG. 7 schematically shows a side view of another embodiment of a single one of the OLED pixels including three subpixel elements including a flat optics lens including a first flat lens, a second convex lens and a third convex lens, in accordance with the disclosure.

FIG. 7 schematically shows a side view of another embodiment of a single one of the OLED pixels 20, with corresponding subpixel OLED elements 30, 40 and 50, and a lens element 730 that is composed of two different materials that display flat optics employing a gradient refractive index lens 735. Alternatively, the lens element 730 may be composed of one material that can form a gradient refractive index with parabolic phase profile for a convex lens. This embodiment is analogous to the embodiment of FIG. 3, including the second subpixel OLED element 40 being fitted with a convex first lens 745 and the third subpixel OLED element 50 being fitted with a convex second lens 755. The refractive indices of the first and second lenses 745, 755 are selected and formed in the same manner as described with reference to FIG. 3, and are formed to have a concave lens effect. Both the first and second lens 745, 755 and the first subpixel OLED element 30 are coated by the gradient refractive index lens 735, providing a flat surface having a desired surface refractive index that further reduces color shifts at oblique viewing angles.

Figure 8:
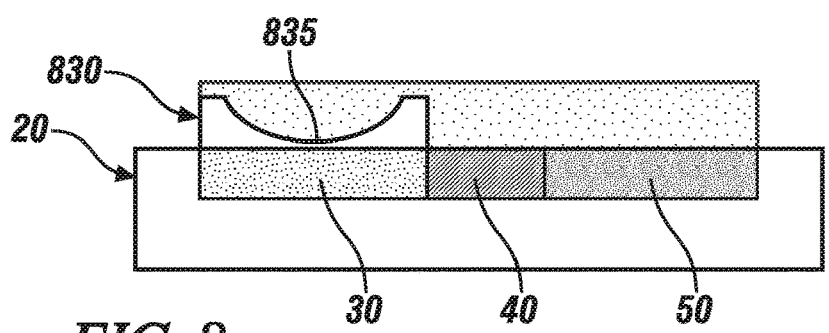
FIG. 8 schematically shows a side view of another embodiment of a single one of the OLED pixels including three subpixel elements including a flat optics lens including a first concave lens, and a second flat lens, in accordance with the disclosure.

FIG. 8 schematically shows a side view of another embodiment of a single one of the OLED pixels 20, with corresponding subpixel OLED elements 30, 40 and 50, and a lens element 830 that is composed of a single material, or two different materials that display flat optics employing a gradient refractive index lens. This embodiment is analogous to the embodiment of FIG. 6, including the first subpixel OLED element 30 being a concave first lens 835 having a gradient refractive index, and the second and third subpixel OLED elements 40, 50 being uncoated. The refractive index of the first lens 835 is selected and formed to have a concave lens effect in the same manner as described with reference to FIG. 6. Both the first lens 835 and the second and third subpixel OLED elements 40, 50 are coated by the gradient refractive index lens 835, providing a flat surface having a desired surface refractive index that further reduces color shifts at oblique viewing angles.

Figure 9:
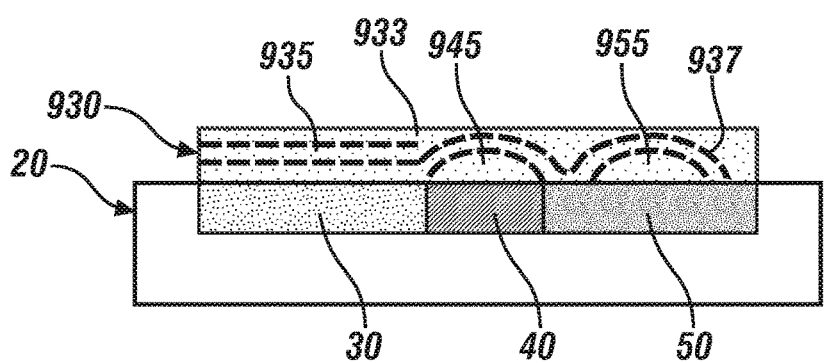
FIG. 9 schematically shows a side view of another embodiment of a single one of the OLED pixels including three subpixel elements including a liquid crystalline polymer composite lens including a first flat liquid crystal lens, a second convex liquid crystal lens and a third convex liquid crystal lens, in accordance with the disclosure.

FIG. 9 schematically shows a side view of another embodiment of a single one of the OLED pixels 20, with corresponding subpixel OLED elements 30, 40 and 50, and a lens element 930 that is composed of two different materials that display flat optics employing a gradient refractive index lens 933 that is formed by means of the liquid crystal element 937. This embodiment is analogous to the embodiment of FIG. 3, including the second subpixel OLED element 40 being fitted with a convex first lens 945 that is formed from liquid crystal material and the third subpixel OLED element 50 being fitted with a convex second lens 955 that is formed from liquid crystal material 937. The refractive indices of the first and second lenses 945, 955 are selected and formed in the same manner as described with reference to FIG. 3. The first subpixel OLED element 30 is fitted with a flat lens 935 that is formed from the liquid crystal element 937. Both the first and second lens 945, 955 and the flat lens 935 are coated by the gradient refractive index lens 933, providing a flat surface having a desired surface refractive index that further reduces color shifts at oblique viewing angles. Again, the flat lens 935 has no refractive effect. The liquid crystal element 937 may be composed from ferroelectric SmC liquid crystal material in one embodiment.

Figure 10:
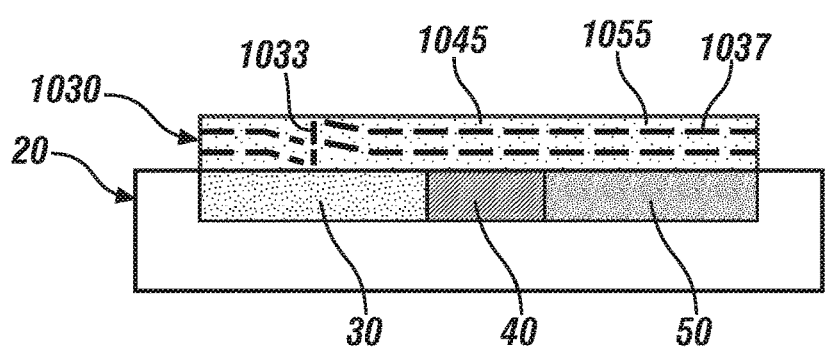
FIG. 10 schematically shows a side view of another embodiment of a single one of the OLED pixels including three subpixel elements including a liquid crystalline polymer composite lens including a first concave liquid crystal lens, a second flat liquid crystal lens and a third flat liquid crystal lens, in accordance with the disclosure.

FIG. 10 schematically shows a side view of another embodiment of a single one of the OLED pixels 20, with corresponding subpixel OLED elements 30, 40 and 50, and a lens element 1030 that is composed of two different materials that display flat optics employing a gradient refractive index lens 1033 and a liquid crystal element 1037. This embodiment is analogous to the embodiment of FIG. 6 and, including the first subpixel OLED element 40 being fitted with a concave first lens 1035 that is formed by means of the liquid crystal material 1037. The refractive index of the first lens 1035 is selected and formed in the same manner as described with reference to FIG. 6. The second and third subpixel OLED elements 40 and 50 are fitted with a flat lens 1045, 1055 that is formed from the liquid crystal material 1037. Both the first lens 1035 and the flat lens 1045, 1055 are coated by the gradient refractive index lens 1033, providing a flat surface having a desired surface refractive index that further reduces color shifts at oblique viewing angles.

An optical component that reduces blue-shift of organic light-emitting diode (OLED) display at oblique viewing angle via beam shaping at subpixel level. The additional benefit is the improvement of OLED display lifetime.

The detailed description and the drawings or figures are supportive and descriptive of the present teachings, but the scope of the present teachings is defined solely by the claims. While some of the best modes and other embodiments for carrying out the present teachings have been described in detail, various alternative designs and embodiments exist for practicing the present teachings defined in the appended claims.

What is claimed is:

1. An optical device, comprising:
   an organic light-emitting diode (OLED) pixel composed of a plurality of subpixel elements,
   the subpixel elements including a first subpixel element disposed to emit a first light beam having a first color, a second subpixel element disposed to emit a second light beam having a second color, and a third subpixel element disposed to emit a third light beam having a third color;
   the first subpixel element exhibiting a first light divergence angle;
   the second subpixel element exhibiting a second light divergence angle;
   the third subpixel element exhibiting a third light divergence angle;
   a first lens disposed on the second subpixel element, wherein the first lens is formed having a first refractive index, wherein the first refractive index is configured to refract the second light beam of the second subpixel element to a second refracted light divergence angle that is equivalent to the first light divergence angle; and
   a second lens disposed on the third subpixel element, wherein the second lens has a second refractive index, wherein the second refractive index is configured to refract the third light beam of the third subpixel element to a third refracted light divergence angle that is equivalent to the first light divergence angle.

2. The optical device of claim 1, wherein the first lens disposed on the second subpixel element comprises a convex lens.

3. The optical device of claim 1, wherein the first lens disposed on the second subpixel element comprises a concave lens.

4. The optical device of claim 1, wherein the first lens disposed on the second subpixel element and the second lens disposed on the third subpixel element comprise convex lenses that are disposed as a single unitary lamination layer.

5. The optical device of claim 1, wherein the first color is red, the second color is green and the third color is blue.

6. The optical device of claim 1, wherein the first and second lenses are composed from two different materials that display flat optics employing a gradient refractive index lens.

7. The optical device of claim 1, wherein the first and second lenses are composed from two different materials that display flat optics employing a gradient refractive index lens and a liquid crystal element.

8. The optical device of claim 1, wherein the first and second lenses comprise microlenses that are directly printed onto the respective second and third subpixel elements.

9. The optical device of claim 1, wherein the first and second lenses comprise microlenses that are formed as a laminate sheet that is applied onto a surface of the OLED pixel.

10. An optical device, comprising:
    an organic light-emitting diode (OLED) pixel composed of a plurality of subpixel elements,
    the subpixel elements including a first subpixel element disposed to emit a first light beam having a first color and a second subpixel element disposed to emit a second light beam having a second color;
    the first subpixel element exhibiting a first light divergence angle;
    the second subpixel element exhibiting a second light divergence angle; and
    a first lens disposed on the second subpixel element, wherein the first lens is formed having a first refractive index, wherein the first refractive index is configured to refract the second light beam of the second subpixel element to a second refracted light divergence angle that is equivalent to the first light divergence angle.

11. The optical device of claim 10, wherein the first lens disposed on the second subpixel element comprises a convex lens disposed to diverge the second light beam.

12. The optical device of claim 10, wherein the first lens disposed on the second subpixel element comprises a concave lens disposed to converge the second light beam.

13. The optical device of claim 10, wherein the first lens is composed from a material that displays flat optics employing a gradient refractive index lens.

14. The optical device of claim 10, wherein the first lens comprises a microlens that is directly printed onto the respective subpixel element.

15. The optical device of claim 10, wherein the first lens comprises a microlens that is formed as a laminate sheet that is applied onto a surface of the OLED pixel.

16. An optical device, comprising:
    an organic light-emitting diode (OLED) pixel composed of a plurality of subpixel elements,
    the subpixel elements including a first subpixel element disposed to emit a first light beam having a first color, a second subpixel element disposed to emit a second light beam having a second color, and a third subpixel element disposed to emit a third light beam having a third color;
    the first subpixel element exhibiting a first light divergence angle;
    the second subpixel element exhibiting a second light divergence angle;
    the third subpixel element exhibiting a third light divergence angle; and
    a first lens disposed on the first subpixel element, wherein the first lens is formed having a first refractive index, wherein the first refractive index is configured to refract the first light beam of the first subpixel element to a second refracted light divergence angle that is equivalent to the second light divergence angle.

17. The optical device of claim 16, wherein the first lens disposed on the first subpixel element comprises a convex lens, and wherein the first refractive index is disposed to diverge the first light beam.

18. The optical device of claim 16, wherein the first lens disposed on the first subpixel element comprises a concave lens, and wherein the first refractive index is disposed to converge the first light beam.

19. The optical device of claim 16, wherein the first lens is composed from a material that displays flat optics employing a gradient refractive index lens.

20. The optical device of claim 16, wherein the first lens comprises a microlens that is directly printed onto the respective subpixel element.

\* \* \* \* \*